(12) United States Patent
Zhang et al.

(10) Patent No.: US 10,691,015 B2
(45) Date of Patent: *Jun. 23, 2020

(54) INTEGRATED MASK-AWARE LITHOGRAPHY MODELING TO SUPPORT OFF-AXIS ILLUMINATION AND MULTI-TONE MASKS

(71) Applicant: Synopsys, Inc., Mountain View, CA (US)

(72) Inventors: Hongbo Zhang, Beaverton, OR (US); Qiliang Yan, Portland, OR (US)

( * ) Notice: Subject to any disclaimer, the term of this patent is extended or adjusted under 35 U.S.C. 154(b) by 980 days.

This patent is subject to a terminal disclaimer.

(21) Appl. No.: 15/169,326

(22) Filed: May 31, 2016

(65) Prior Publication Data

US 2016/0349608 A1    Dec. 1, 2016

Related U.S. Application Data

(63) Continuation of application No. 14/099,885, filed on Dec. 6, 2013, now Pat. No. 9,354,511.

(51) Int. Cl.
| | |
|---|---|
| *G06F 7/60* | (2006.01) |
| *G03F 1/36* | (2012.01) |
| *G03F 7/20* | (2006.01) |
| *G06F 30/20* | (2020.01) |
| *G03F 7/00* | (2006.01) |
| *G06F 17/11* | (2006.01) |

(52) U.S. Cl.
CPC .................. *G03F 1/36* (2013.01); *G03F 7/00* (2013.01); *G03F 7/705* (2013.01); *G03F 7/70125* (2013.01); *G03F 7/70283* (2013.01); *G06F 17/11* (2013.01); *G06F 30/20* (2020.01)

(58) Field of Classification Search
CPC ........ G03F 1/36; G03F 7/705; G03F 7/70441; G03F 7/70666; G03F 1/70; G03F 7/70558; G03F 7/70433; G03F 1/78
USPC .................................... 716/50–55; 430/5, 30
See application file for complete search history.

(56) References Cited

U.S. PATENT DOCUMENTS

| | | | |
|---|---|---|---|
| 7,703,069 B1 | 4/2010 | Liu et al. | |
| 7,788,628 B1 * | 8/2010 | Wei ..................... | G03F 7/70425 716/51 |
| 7,818,710 B2 | 10/2010 | Wang et al. | |
| 7,873,204 B2 * | 1/2011 | Wihl ....................... | G03F 1/84 382/144 |
| 7,921,383 B1 * | 4/2011 | Wei ........................ | G03F 7/705 703/13 |

(Continued)

OTHER PUBLICATIONS

Huang, Hsu-Ting, et al, "Full-chip OPC and verification with a fast mask 3D model," Proc. of SPIE vol. 7973, Mar. 22, 2011, 9 pages. cited by applicant.

(Continued)

*Primary Examiner* — Nghia M Doan

(57) ABSTRACT

A method and apparatus of a novel modeling scheme for performing optical lithography simulation for a multi-tone mask with a plurality of mask tones is described. The method generates a transmission function matrix based on a setting of the multi-tone mask. The method applies the transmission function matrix to transform a formula for calculating light intensity from Abbe's form to Hopkins' form while maintaining the accuracy of Abbe's form. The method then computes the light intensity using the transformed formula.

14 Claims, 9 Drawing Sheets

(56) References Cited

U.S. PATENT DOCUMENTS

| | | |
|---|---|---|
| 8,136,054 B2 | 3/2012 | Chen et al. |
| 8,271,910 B2 | 9/2012 | Tirapu-Azpiroz et al. |
| 8,352,885 B2 | 1/2013 | Liu et al. |
| 8,918,743 B1 | 12/2014 | Yan et al. |
| 2006/0209314 A1 | 9/2006 | Latypov et al. |
| 2007/0245292 A1 | 10/2007 | Satake et al. |
| 2008/0170773 A1* | 7/2008 | Wihl .................... G03F 1/84 382/144 |
| 2008/0204690 A1 | 8/2008 | Berger et al. |
| 2010/0162199 A1 | 6/2010 | Liu et al. |
| 2010/0175042 A1 | 7/2010 | Azpiroz et al. |
| 2010/0275178 A1 | 10/2010 | Wei |
| 2013/0139118 A1 | 5/2013 | Liu et al. |

OTHER PUBLICATIONS

Liu, Peng, "Accurate prediction of 3D mask topography induced best focus variation in full-chip photolithography applications," Proc. of SPIE vol. 8166, Oct. 13, 2011, 8 pages. cited by applicant.

Liu, Peng, et al, "A full-chip 3D computational lithography framework," Proc. of SPIE vol. 8326, Feb. 21, 2012, 18 pages. cited by applicant.

* cited by examiner

INTEGRATED MASK-AWARE LITHOGRAPHY MODELING TO SUPPORT OFF-AXIS ILLUMINATION AND MULTI-TONE MASKS

RELATED APPLICATION

The present application is a continuation of U.S. patent application Ser. No. 14/099,885, filed on Dec. 6, 2013, issuing as U.S. Pat. No. 9,354,511 on May 31, 2016, and incorporates that application in its entirety.

FIELD

The present invention relates to electronic design automation and in particular to simulating photolithography processes.

BACKGROUND

Photolithography is a process used in microfabrication to pattern the bulk of a substrate. It uses light to transfer a geometric pattern from an optical mask to a light-sensitive chemical "photoresist," or simply "resist," on the substrate. The pattern in the resist is created by exposing it to light with a projected image using an optical mask.

Optical proximity correction (OPC) is a photolithography enhancement technique commonly used to compensate for image errors due to diffraction or process effects. OPC corrects image errors by moving edges or adding extra polygons to the pattern written on the optical mask. Model based OPC uses compact models to dynamically simulate the final pattern and thereby derive the movement of edges, typically broken into sections, to find the best solution. The objective is to reproduce, as well as possible, the original layout drawn by the designer in the silicon wafer.

The cost of manufacturing advanced mask sets is steadily increasing as technology becomes more and more complex. In addition, turn-around time is always an important consideration in semiconductor manufacturing. As a result, computer simulations of the photolithography process, which assist in reducing both the cost and turn-around time, have become an integral part of semiconductor manufacturing.

As semiconductor feature sizes continue to shrink further below the exposure wavelength, mask topography effect, also called thick mask effect or mask three-dimensionality (3D), becomes an increasingly significant factor impacting the photolithography modeling and full chip OPC process. Off-axis illumination (OAI) is an optical system setup in which the incoming light strikes the optical mask at an oblique angle rather than perpendicularly. That is to say, the incident light is not parallel to the axis of the optical system. OAI brings additional complication to the photolithography simulation of mask topography effect.

One of the most important inputs to any photolithography simulation system is the model for the interaction between the illuminating electric field and the mask. Among different types of modeling schemes for tackling OAI, Abbe's method is usually considered to be accurate. Abbe's method finds the light intensity at the resist for each single point on the light source and then integrates them together. Therefore, Abbe's method runs extremely slowly, making it impractical for full chip level implementation. Instead, application of Abbe's method is limited to small areas of a chip design layout.

In Hopkins' method, the integration over the light source is done before calculating the inverse Fourier integrals. The major advantage of Hopkins' method is that source-dependent information is completely independent of the mask function and can be pre-computed and stored, thus reducing much of the computational effort during lithography simulation. However, because source dependent information and mask geometry are mixed together in the situation of OAI and multi-tone masks, Hopkins' method can be very inaccurate in light intensity calculation.

The prior art of the filter-based mask 3D modeling schemes uses scaling parameters to generate equivalent mask field. Filter-based models with fitting parameters have obvious shortages. For example, the calibrated parameters are pattern dependent, transmission and phase are fixed (which should be angle-dependent), the fitting parameters for edge-coupling and OAI parameter can hardly co-exist, and multi-tone mask might not be calibrated well because different tones have different behavior. Consequently, conventional filter-based modeling schemes cannot accurately perform photolithography simulation to support OAI and multi-tone masks.

A hybrid approach splits the light source into several regions, and processes each region individually (e.g., by using filter-based models). The hybrid approach is a compromise between Abbe's method and Hopkins' method. It is faster than Abbe's method, but not as accurate as Abbe's method. The hybrid approach is also several times slower than the filter-based modeling schemes.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

Figure 1:
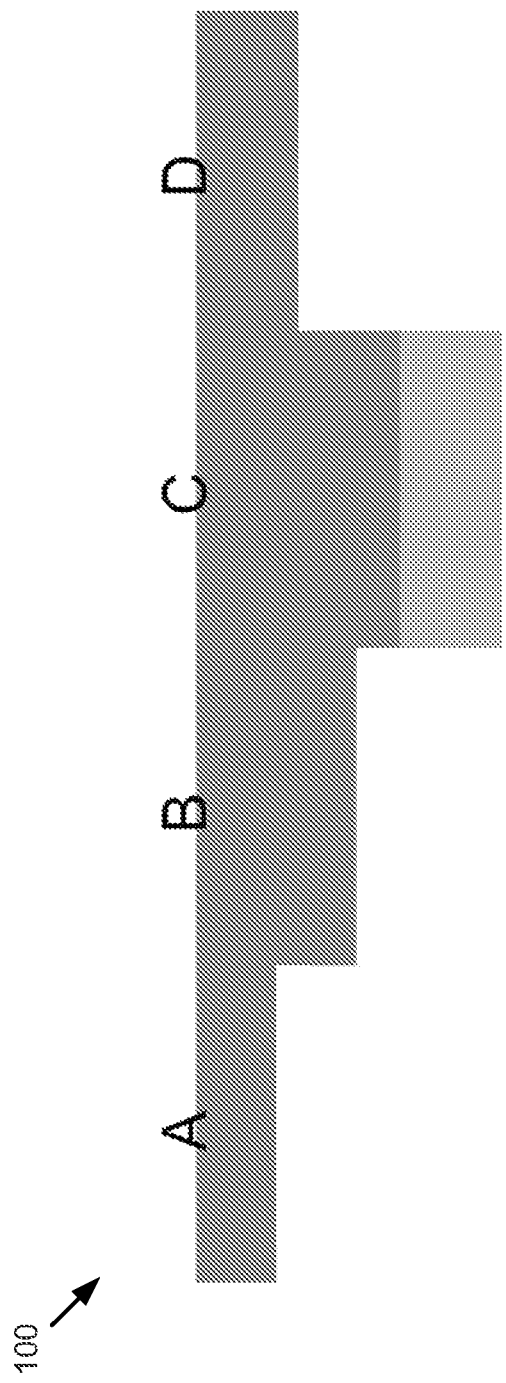
FIG. 1 illustrates an example of a multi-tone mask that has several different mask tones.

A novel integrated mask-aware lithography modeling scheme for supporting OAI and multi-tone masks is described. The integrated mask-aware lithography modeling scheme separates source-dependent information from mask geometry. Therefore, Hopkins' method can be extended to deal with source-dependent mask transmission. In one embodiment, a multi-tone mask is considered to be a summation of individual tone masks. Convolution kernels are generated for individual tone masks in accordance with Hopkins' method. In one embodiment, convolution kernels are compressed by recognizing the correlation between tone masks. As a result, the new modeling scheme enjoys the speed of Hopkins' approach and the accuracy of Abbe's approach. Since no data fitting is needed in the new modeling scheme, the pattern dependency issue is completely resolved.

In an exemplary embodiment, a method and apparatus receives a setting of a multi-tone mask that has a plurality of mask tones. The method generates a transmission function matrix based on the setting of the multi-tone mask. The method applies the transmission function matrix to transform a formula for calculating light intensity from Abbe's form to Hopkins' form while maintaining the accuracy of Abbe's form. The method computes the light intensity using the transformed formula. To generate the transmission function matrix, in one embodiment, the method transforms mask transmission under each light source point to a linear combination of a plurality of Zernike functions.

To apply the transmission function matrix to transform the formula for calculating light intensity, in one embodiment, the method generates a set of convolution kernels for each mask tone based on the transmission function matrix. The method reduces the generated convolution kernels and generates model data from the reduced convolution kernels.

To reduce the convolution kernels, in one embodiment, the method generates a set of Eigen-kernels for each mask tone based on the convolution kernels. The method retains a first set and a second set of Eigen-kernels. In one embodiment, the method reduces the first and second sets of Eigen-kernels so that the first set of Eigen-kernels is larger than the second set of Eigen-kernels. In one embodiment, the first retained set of Eigen-kernels is used for the major calculation and the second retained set of Eigen-kernels is used for accuracy enhancement.

To compute the light intensity, in one embodiment, the method generates a first Eigen-mask and a second Eigen-mask based on the model data. The method generates a first partial E-field and a second partial E-field based on the first and second Eigen-masks and the first and second sets of Eigen-kernels. The method generates the light intensity by combining the first partial E-field and the second partial E-field. In one embodiment, the method generates the first partial E-field by convolving the first Eigen-mask and the first set of Eigen-kernels. The method generates the second partial E-field by convolving the second Eigen-mask and the second set of Eigen-kernels.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

FIG. 1 illustrates an example of a multi-tone mask that has several different mask tones. Specifically, this figure shows a multi-tone mask 100 that has four different mask tones A-D. Each mask tone represents different coating and etching parameters on the mask. As a result, different mask tones have different mask transmissions. One of ordinary skill in the art would recognize that a multi-tone mask can have different number of mask tones. For example, a multi-tone mask can have two mask tones, three mask tones, or have four or more mask tones.

Figure 2:
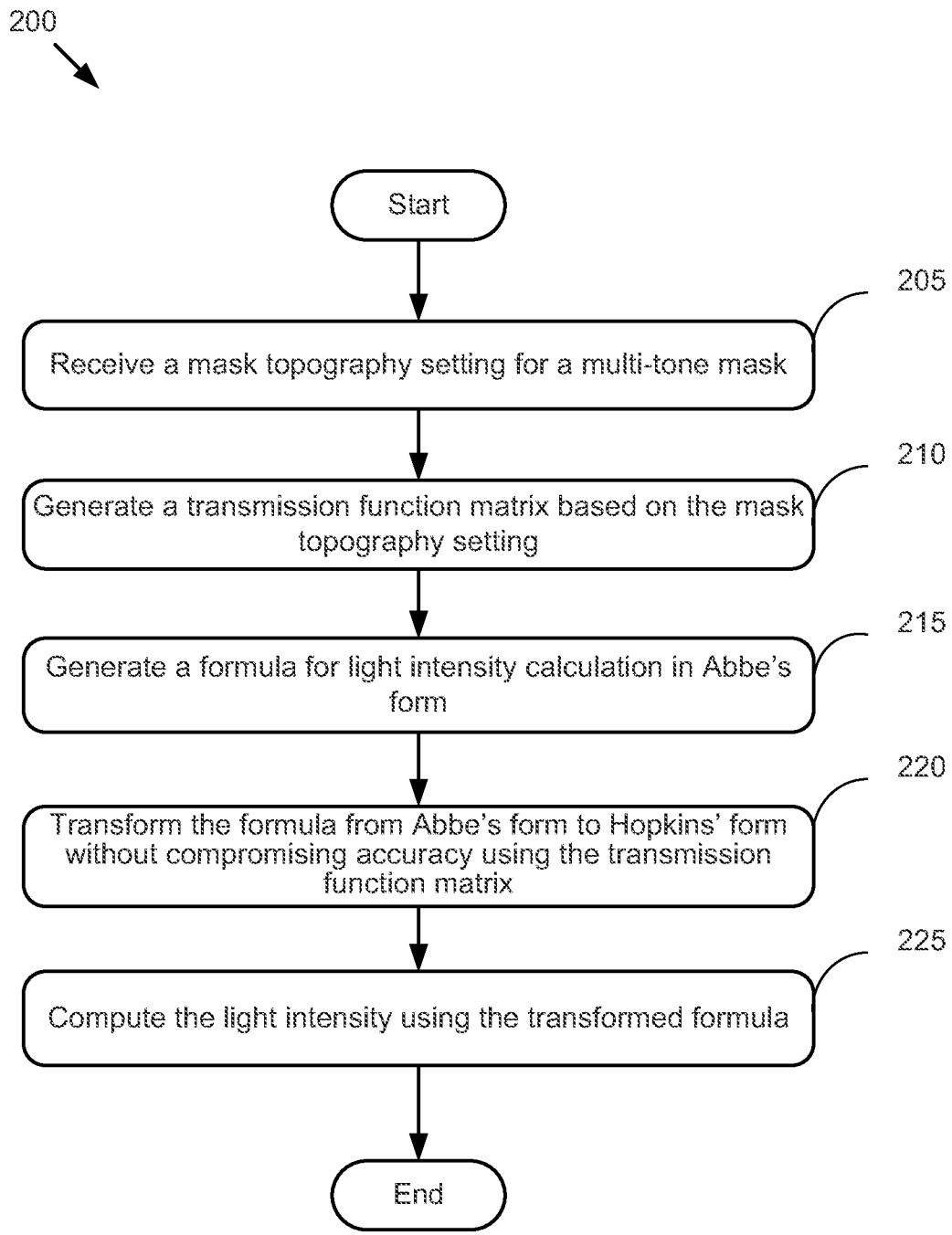
FIG. 2 is an overview flowchart of one embodiment of using mask-aware lithography modeling scheme for supporting off-axis illumination and multi-tone masks.

FIG. 2 is an overview flowchart of one embodiment of using mask-aware lithography modeling scheme for supporting OAI and multi-tone masks. Specifically, this figure describes a process 200 that transforms a formula for light intensity calculation from Abbe's form to Hopkins' form in order to speed up the simulation process while maintaining accuracy. In one embodiment, the process 200 starts when a design layout of a multi-tone mask needs to be verified to see if it can produce the desired wafer pattern. The process 200 begins by receiving, at block 205, a mask topography setting for a multi-tone mask. In one embodiment, the mask topography setting is in the form of a polygon-based hierarchical data file in the GDS (Graphic Database System) or OASIS-.MASK format. In another embodiment, other formats for representing the mask topography setting may be used.

At block 210, the process 200 generates a transmission function matrix based on the mask topography setting. Some embodiments of generating the transmission function matrix will be further described in Equations (1)-(4) below.

The process 200, at block 215, generates a formula for light intensity calculation in Abbe's form. At block 220, the process 200 transforms the formula from Abbe's form to Hopkins' form without compromising accuracy using the transmission function matrix. Some embodiments of transforming the formula for light intensity calculation using the transmission function matrix will be further described in Equations (5)-(7) below.

Different model calibration can achieve different accuracy. For example and in one embodiment, this model with transformed formula can provide an error of less than 1.6 nm critical dimension (CD) root mean square (RMS) compared to a model using Abbe's approach. In another embodiment, this model with transformed formula can provide an error of less than 1.0 nm CD RMS compared to a model using Abbe's approach. In yet another embodiment, this model with transformed formula can provide an error of less than 0.6 nm CD RMS compared to a model using Abbe's approach.

At block 225, the process 200 computes the light intensity using the transformed formula. Some embodiments of computing the light intensity using the transformed formula will be further described in FIGS. 7 and 8 below. Once the light intensity is computed, it can be used to generate a photolithography simulation result. In one embodiment, the photolithography simulation result is displayed on a screen of an electronic device. In another embodiment, the photolithography simulation result is saved to a non-volatile machine readable media. The process 200 then ends.

One of ordinary skills in the art will recognize that the process 200 is a conceptual representation of the operations used to perform photolithography simulation. The specific operations of the process 200 may not be performed in the exact order shown and described. For example, blocks 210 and 215 are not dependent on each other, and therefore can be performed in reverse order or in parallel. The specific operations may not be performed in one continuous series of operations, and different specific operations may be performed in different embodiments. Furthermore, the process could be implemented using several sub-processes, or as part of a larger macro process. For instance, in some embodiments, the process 200 is performed by one or more software applications that execute on one or more computers.

Figure 3:
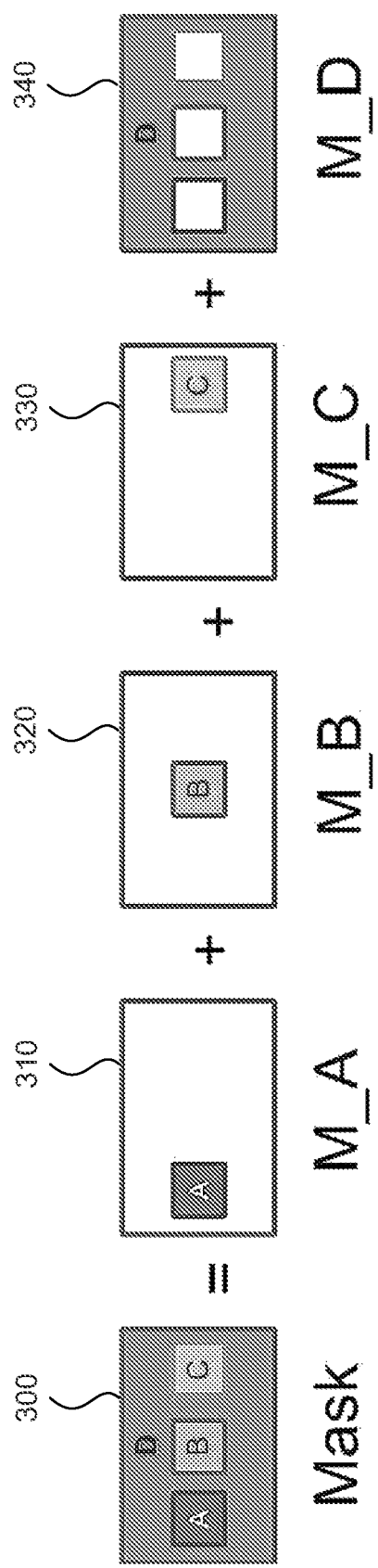
FIG. 3 conceptually illustrates that a multi-tone mask can be considered as a summation of individual tone masks with unique mask transmissions in accordance with one embodiment of the present invention.

FIG. 3 conceptually illustrates that a multi-tone mask can be considered as a summation of individual tone masks with unique mask transmissions in accordance with one embodiment of the present invention. Specifically, this figure shows a multi-tone mask 300 and four individual tone masks 310, 320, 330, and 340. The multi-tone mask 300 has four different mask tones A-D. Each of the four individual tone masks 310, 320, 330, and 340 contains one of the mask tones A-D of the multi-tone mask 300. In one embodiment, the mask transmission for the multi-tone mask 300 can be considered as a summation of the mask transmissions of the four individual tone masks 310, 320, 330, and 340. Although the illustration of FIG. 3 shows only mask tone D adjacent to the other mask tones A-C, mask tones A-C may be directly adjacent to each other, in other embodiments.

Figure 4:
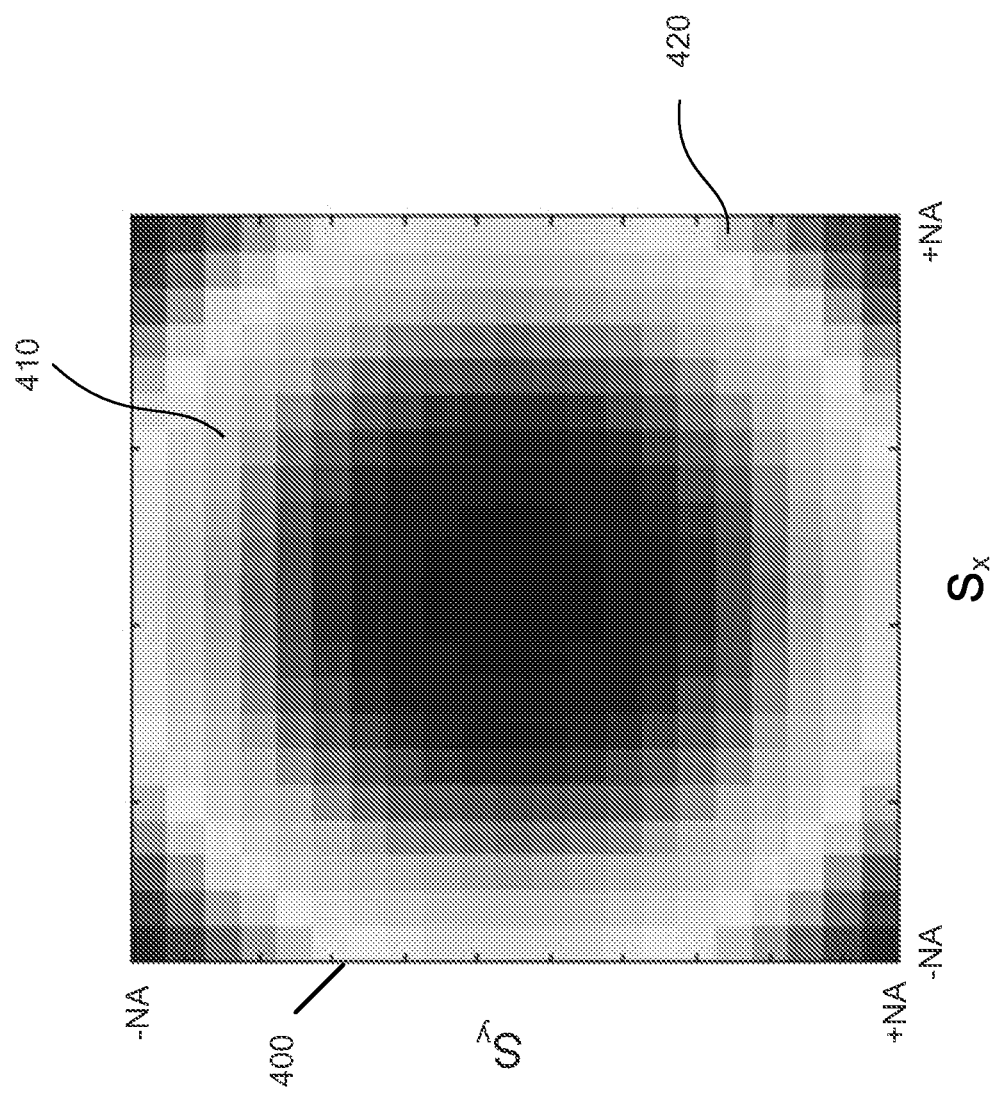
FIG. 4 illustrates an example of X component of mask transmission based X polarized light source array.

FIG. 4 illustrates an example of X component of mask transmission based X polarized light source array. Specifically, this figure shows an $E_{xx}$ transmission 410 for a light source plane 400. As illustrated, there are many OAI atomic points, e.g., OAI atomic point 420, on the light source 400. $S_x$ and $S_y$ represent source point coordinates on the source plane 400. The $E_{xx}$ transmission 410 represents $E_x$ transmission at 0 degrees. Similarly, $E_{xy}$ transmission represents $E_x$ transmission at 90 degrees, transmission represents $E_y$ transmission at 0 degrees, and $E_{yy}$ transmission represents $E_y$ transmission at 90 degrees. The mask transmissions are different at different OAI atomic points, as illustrated by different color/shade for different blocks on the $E_{xx}$ transmission 410.

Figure 5:
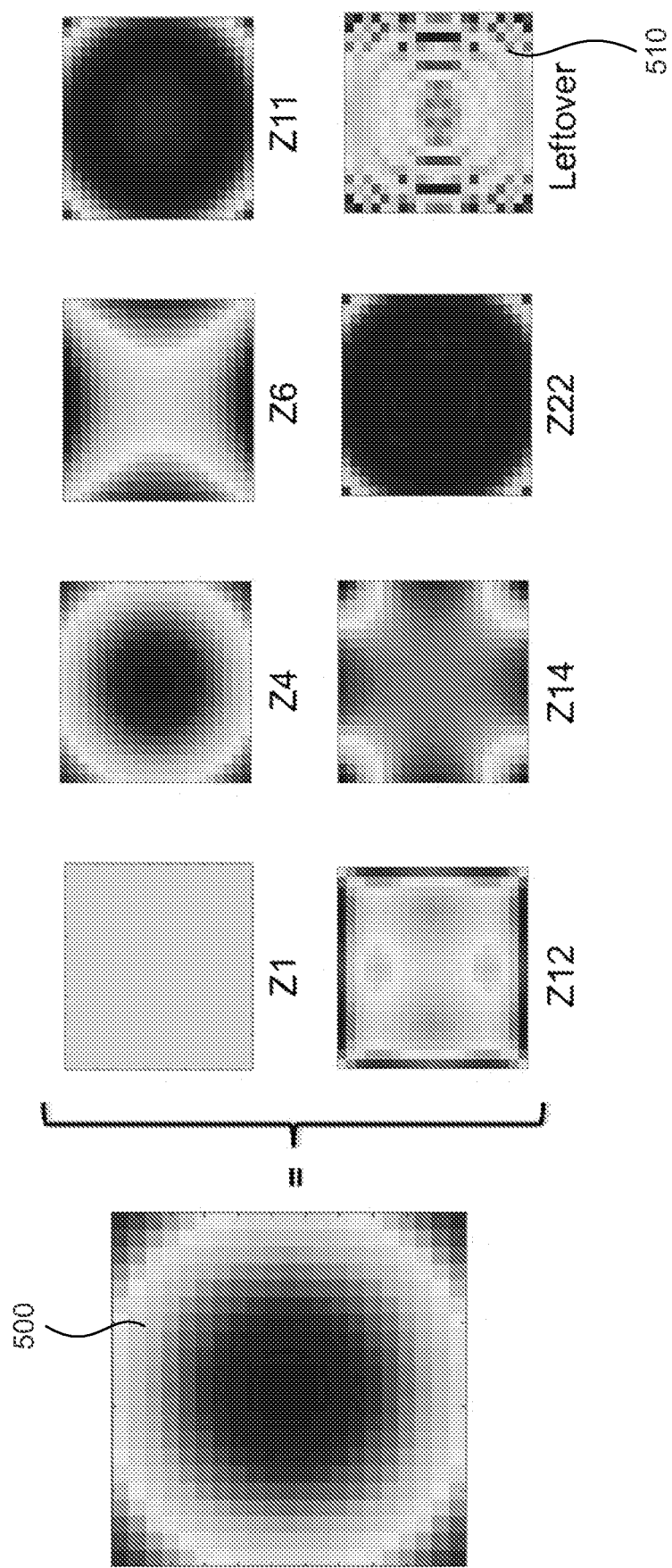
FIG. 5 illustrates that a mask transmission for a source plane can be parameterized accurately by limited Zernike series in accordance with one embodiment of the present invention.

FIG. 5 illustrates a mask transmission for a source plane parameterized accurately by a limited Zernike series in accordance with one embodiment of the present invention. Specifically, this figure shows the mask transmission 500 for a source plane $S(s_x, s_y)$, several Zernike polynomials $Z_1$, $Z_4$, $Z_6$, $Z_{11}$, $Z_{12}$, $Z_{14}$, $Z_{22}$, and a leftover function 510. As illustrated, the mask transmission 500, represented as $O(s_x, s_y)$, can be considered as a linear combination of limited Zernike polynomials plus the ignorable leftover function 510.

Since the mask transmission of a multi-tone mask can be considered as a summation of individual tone masks with unique mask transmissions, as described in FIG. 3 above, under $E_{xx}$ polarization, the transmission for a point (x, y) on a mask image under source point $(s_x, s_y)$ can be expressed as:

$$O_{xx}(x, y | s_x, s_y) = M_A(x, y) * O_{A,xx}(s_x, s_y) + M_B(x, y) * O_{B,xx}(s_x, s_y) + \qquad (1)$$
$$M_C(x, y) * O_{C,xx}(s_x, s_y) + M_D(x, y) * O_{D,xx}(s_x, s_y) + \ldots$$

where $O_{xx}(x,y|s_x,s_y)$ represents the mask transmission for a point (x, y) on a mask image under the source point $(s_x, s_y)$, $O_{i,xx}(s_x,s_y)$ represents the mask transmission for xx polarization of a tone mask i for source point $(s_x, s_y)$, and $M_i(x,y)$ represents a binary field for a tone mask i, when the point (x, y) belongs to the tone mask i, $M_i(x,y)$ equals to 1, otherwise $M_i(x,y)$ equals to 0.

A partial image function for calculating light intensity can be expressed as:

$$I(x|y|s_x, s_y) = \qquad (2)$$
$$\iint_{-\infty}^{+\infty} \iint_{-\infty}^{+\infty} T(x-x', y-y', x-x'', y-y'' | s_x, s_y)$$
$$O(x', y' | s_x, s_y)\overline{O}(x'', y'' | s_x, s_y) dx' dy' dx'' dy''$$

where $I(x,y|s_x,s_y)$ represents the light intensity at point (x, y) on a mask image under light source point $(s_x, s_y)$, (x',y') and (x'',y'') represent coordinates of two object points, $T(x-x',y-y'',x-x'',y-y''|s_x,s_y)$ represents a four dimensional (4D) convolution kernel function based on (x,y), (x',y'), (x'',y''), and $(s_x,s_y)$, $O(x',y'|s_x,s_y)$ represents a mask transmission, and $\overline{O}(x'',y''|s_x,s_y)$ represents a complex conjugate mask transmission function.

Therefore, the object function O(x, y) with polarization can be rewritten as:

$$M \begin{bmatrix} A_{xx} & A_{xy} & A_{yx} & A_{yy} \\ B_{xx} & B_{xy} & B_{yx} & B_{yy} \\ C_{xx} & C_{xy} & C_{yx} & C_{yy} \\ D_{xx} & D_{xy} & D_{yx} & D_{yy} \end{bmatrix} \qquad (3)$$

where $M=[M_A \; M_B \; M_C \; M_D]$ represents a tone mask matrix, and $$\begin{bmatrix} A_{xx} & A_{xy} & A_{yx} & A_{yy} \\ B_{xx} & B_{xy} & B_{yx} & B_{yy} \\ C_{xx} & C_{xy} & C_{yx} & C_{yy} \\ D_{xx} & D_{xy} & D_{yx} & D_{yy} \end{bmatrix},$$

which is actually $$\begin{bmatrix} A_{xx}(s_x, s_y) & A_{xy}(s_x, s_y) & A_{yx}(s_x, s_y) & A_{yy}(s_x, s_y) \\ B_{xx}(s_x, s_y) & B_{xy}(s_x, s_y) & B_{yx}(s_x, s_y) & B_{yy}(s_x, s_y) \\ C_{xx}(s_x, s_y) & C_{xy}(s_x, s_y) & C_{yx}(s_x, s_y) & C_{yy}(s_x, s_y) \\ D_{xx}(s_x, s_y) & D_{xy}(s_x, s_y) & D_{yx}(s_x, s_y) & D_{yy}(s_x, s_y) \end{bmatrix},$$

represents a characteristic transmission function (CT) matrix that can be pre-calculated based on the Zernike matrixes and coefficient matrixes.

The characteristic transmission function (CT) matrix is defined as:

$$CT(s_x, s_y) = \begin{bmatrix} A_{xx}(s_x, s_y) & A_{xy}(s_x, s_y) & A_{yx}(s_x, s_y) & A_{yy}(s_x, s_y) \\ B_{xx}(s_x, s_y) & B_{xy}(s_x, s_y) & B_{yx}(s_x, s_y) & B_{yy}(s_x, s_y) \\ C_{xx}(s_x, s_y) & C_{xy}(s_x, s_y) & C_{yx}(s_x, s_y) & C_{yy}(s_x, s_y) \\ D_{xx}(s_x, s_y) & D_{xy}(s_x, s_y) & D_{yx}(s_x, s_y) & D_{yy}(s_x, s_y) \end{bmatrix} \qquad (4)$$

where $CT(s_x,s_y)$ represents the characteristic transmission function matrix for a source point $(s_x,s_y)$, each element of the CT matrix is calculated based on the Zernike matrixes and coefficient matrixes, each row of the CT matrix represents a different tone mask of the multi-tone mask, each column of the CT matrix represents a different polarization.

The CT matrix is very compact so that the amount of calculation involved in generating the matrix is limited. Because the CT matrix is a function of source point $(s_x,s_y)$, not a function of mask geometry information (x, y), the CT matrix separates the light source information from the mask geometry information. This makes the transformation of the formula for light intensity calculation to Hopkins' form possible. The CT matrix is independent of the number of Zernike polynomials. Because the CT matrix has its analytical form for any given source point $(s_x,s_y)$, no interpolation is needed on source plane. This resolves the pattern dependent issue of prior art methods that involve pattern fitting.

The formula for calculating light intensity in Abbe's form can be expressed as:

$$I(x,y) = \iint_{-\infty}^{+\infty} I(x,y|s_x,s_y) ds_x ds_y \quad (5)$$

By applying Equation (2), the formula in Equation (5) can be transformed to:

$$I(x, y) = \qquad (6)$$
$$\iint_{-\infty}^{+\infty}\iint_{-\infty}^{+\infty}\iint_{-\infty}^{+\infty} T(x-x', y-y', x-x'', y-y'' \mid s_x, s_y)$$
$$O(x', y' \mid sx, sy) \overline{O}(x'', y'' \mid s_x, s_y) dx' dy' dx'' dy'' ds_x ds_y$$

By applying Equation (3), the formula in Equation (6) can be transformed to Hopkins' form:

$$I(x, y) = \qquad (7)$$
$$\iint_{-\infty}^{+\infty}\iint_{-\infty}^{+\infty} M(x', y') TCC'(x, y \mid x', y', x'', y'') M^*(x'', y'')$$
$$dx' dy' dx'' dy''$$

where
$TCC'(x,y|x',y',x'',y'') = \iint_{-\infty}^{+\infty} CT(s_x,s_y) T(x-x',y-y',x-x'',y-y''|s_x,s_y) CT^*(s_x,s_y) ds_x ds_y$ represents the convolution kernel of the multi-tone mask and a new transmission coherence coefficient for Hopkins' method.

Therefore, the formula for light intensity calculation in Abbe's form as in Equation (5) can be transformed to Hopkins' form in Equation (7) by applying the characteristic transmission function matrix CT. The convolution kernel TCC' includes all the information for the light source. This transformation from Abbe's form to Hopkins' form speeds up the calculation while maintaining the accuracy of Abbe's method.

The convolution kernel TCC' can be decomposed through SVD to generate several sets of retained convolution kernels. Each set of convolution kernels corresponds to a tone mask and has an ordered set of kernels. Because convolution kernels with the same index in each set are similar, e.g., the same type, in one embodiment, Eigen-masks are introduced by linear combination of each tone mask to reduce the kernel numbers and convolution time as below:

$$[M_1 M_2 M_3 M_4] = [M_A M_B M_C M_D] V^* \quad (8)$$

such that the Eigen-kernels have:

$$[K_1 K_2 K_3 K_4] = [K_A K_B K_C K_D] V^{*-1} \quad (9)$$

where
$M_A M_B M_C M_D$ represent a binary field for each tone mask assuming there are total 4 tone masks A-D, $M_1 M_2 M_3 M_4$ represent Eigen-masks that are a linear combination of $M_A M_B M_C M_D$, $V^*$ represents a linear transform vector that is the conjugate transpose of the n×n unitary matrix V, $K_A K_B K_C K_D$ represent convolution kernel sets for each tone mask, and $K_1 K_2 K_3 K_4$ represent Eigen-kernel sets that are a linear combination of $K_A K_B K_C K_D$.

Weights are assigned to each Eigen-kernel set. In one embodiment, the weights assigned to Eigen-kernel set $K_1$ is greater than the weights assigned to Eigen-kernel set $K_2$, which is greater than the weights assigned to Eigen-kernel set $K_3$, which is greater than the weights assigned to Eigen-kernel set $K_4$. For example and in one embodiment, Eigen-kernel set $K_1$ carries 98.51% of total weight, Eigen-kernel set $K_2$ carries 1.45% of total weight, Eigen-kernel set $K_3$ carries 0.04% of total weight, and Eigen-kernel set $K_4$ carries zero weight. In one embodiment, only two Eigen-masks and the corresponding two sets of Eigen-kernels are used to calculate the light intensity to obtain a sufficiently accurate intensity estimation.

In one embodiment, each set of Eigen-kernels contains a large number of kernels. In order to reduce the amount of computation, the number of kernels in each set of Eigen-kernels can be reduced while maintaining relatively high accuracy. The more kernels retained in each Eigen-kernel set, the higher the accuracy of the calculated light intensity. For example and in one embodiment, only 2 sets of Eigen-kernels $K_1$ and $K_2$ are used to calculate the light intensity. The number of kernels in both $K_1$ and $K_2$ can be reduced while maintaining relatively high accuracy. In one embodiment, Eigen-kernel set $K_2$ can maintain the same level of accuracy (e.g., 99.5% accuracy) while reducing more than Eigen-kernel set $K_1$ because Eigen-kernel set $K_2$ is assigned less weight than Eigen-kernel set $K_1$. For example and in one embodiment, in order to maintain 99% accuracy, Eigen-kernel set $K_2$ can retain only 31 kernels while Eigen-kernel set $K_1$ retains 307 kernels. The larger Eigen-kernel set $K_1$ is for the major calculation and the smaller Eigen-kernel set $K_2$ is for accuracy enhancement.

Figure 6:
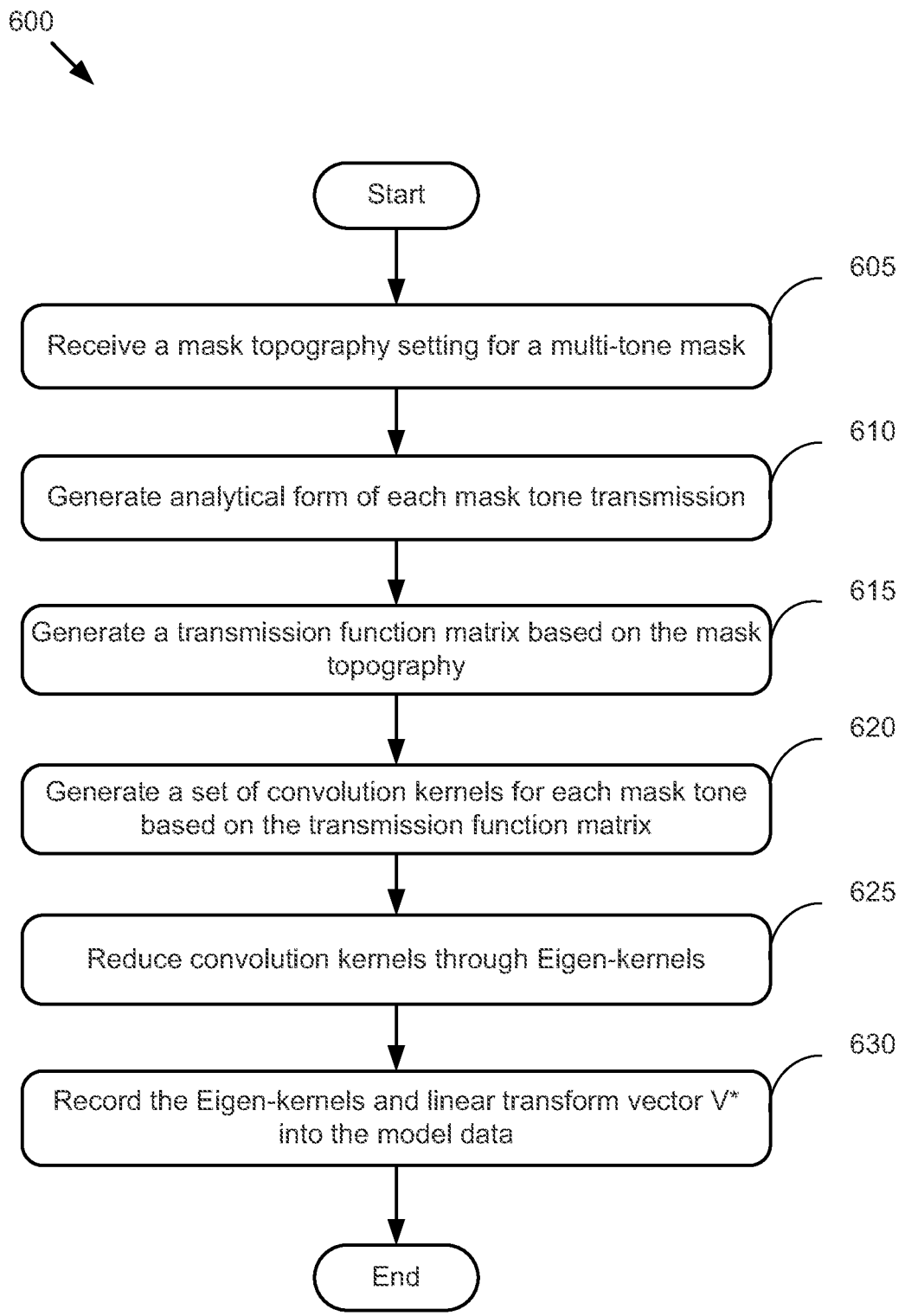
FIG. 6 is a flowchart of one embodiment of generating model data.

FIG. 6 is a flowchart of one embodiment of generating the model data. Specifically, this figure describes a process 600 that generates convolution kernels of the model, described above with respect to Equations (1)-(9). A kernel is a function that can be applied to an image through convolution in order to generate certain effects. In one embodiment, the process 600 starts when a design layout of a multi-tone mask needs to be verified to see if it can produce the desired wafer pattern. The process 600 begins by receiving, at block 605, a mask topography setting for a multi-tone mask. In one embodiment, the mask topography setting is a combination of the factors, including material, geometry setting and process variations, in mask making and implementations. In one embodiment, the mask topography setting is in the form of a polygon-based hierarchical data file in the GDS (Graphic Database System) or OASIS.MASK format.

At block 610, the process 600 generates the analytical form of each mask tone transmission. At block 615, the process 600 generates a transmission function matrix based on the mask topography setting. In one embodiment, the transmission function matrix can be generated in accordance with Equations (1)-(4) described above.

The process, at block 620, generates a set of convolution kernels for each mask tone based on the transmission function matrix. The set of convolution kernels for each mask tone can be generated through performing singular value decomposition on the convolution kernel for the multi-tone mask. In one embodiment, the generated convolution kernels can be used to transform a formula for calculating light intensity from Abbe's form to Hopkins' form while maintaining the accuracy of Abbe's form.

At block 625, the process 600 reduces the number of convolution kernels. In one embodiment, the process 600 reduces convolution kernels through generating Eigen-kernels, as described in Equations (8) and (9) above, and retaining a subset of generated Eigen-kernels. In one embodiment, only two sets of Eigen-kernels are retained. In one embodiment, the number of kernels in each retained Eigen-kernel set is further reduced while maintaining a relatively high accuracy. In one embodiment, the two retained Eigen-kernel sets are reduced to contain different numbers of kernels, a larger set of Eigen-kernels for the major calculation and a smaller set of Eigen-kernels for accuracy enhancement. In one embodiment, the two retained Eigen-kernel sets can be used to transform a formula for calculating light intensity from Abbe's form to Hopkins' form while maintaining the accuracy of Abbe's form.

Different model calibration can achieve different accuracy. For example and in one embodiment, this model with transformed formula can provide an error of less than 1.6 nm CD RMS compared to a model using Abbe's approach. In another embodiment, this model with transformed formula can provide an error of less than 1.0 nm CD RMS compared to a model using Abbe's approach. In yet another embodiment, this model with transformed formula can provide an error of less than 0.6 nm CD RMS compared to a model using Abbe's approach.

At block 630, the process 600 records the Eigen-kernels and linear transform vector V* into the model data. The model data is for calculating the light intensity using the Hopkins' method. In one embodiment, the model data is generated from the reduced convolution kernels and linear transform vector V*. In one embodiment, the linear transform vector V* is described in Equations (8) and (9) above. In one embodiment, the model data is stored in a database. In another embodiment, the model data is stored into one or more files. The process 600 then ends.

One of ordinary skill in the art will recognize that the process 600 is a conceptual representation of the operations used to generate the model data. The specific operations of the process 600 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 600 is performed by one or more software applications that execute on one or more computers.

Figure 7:
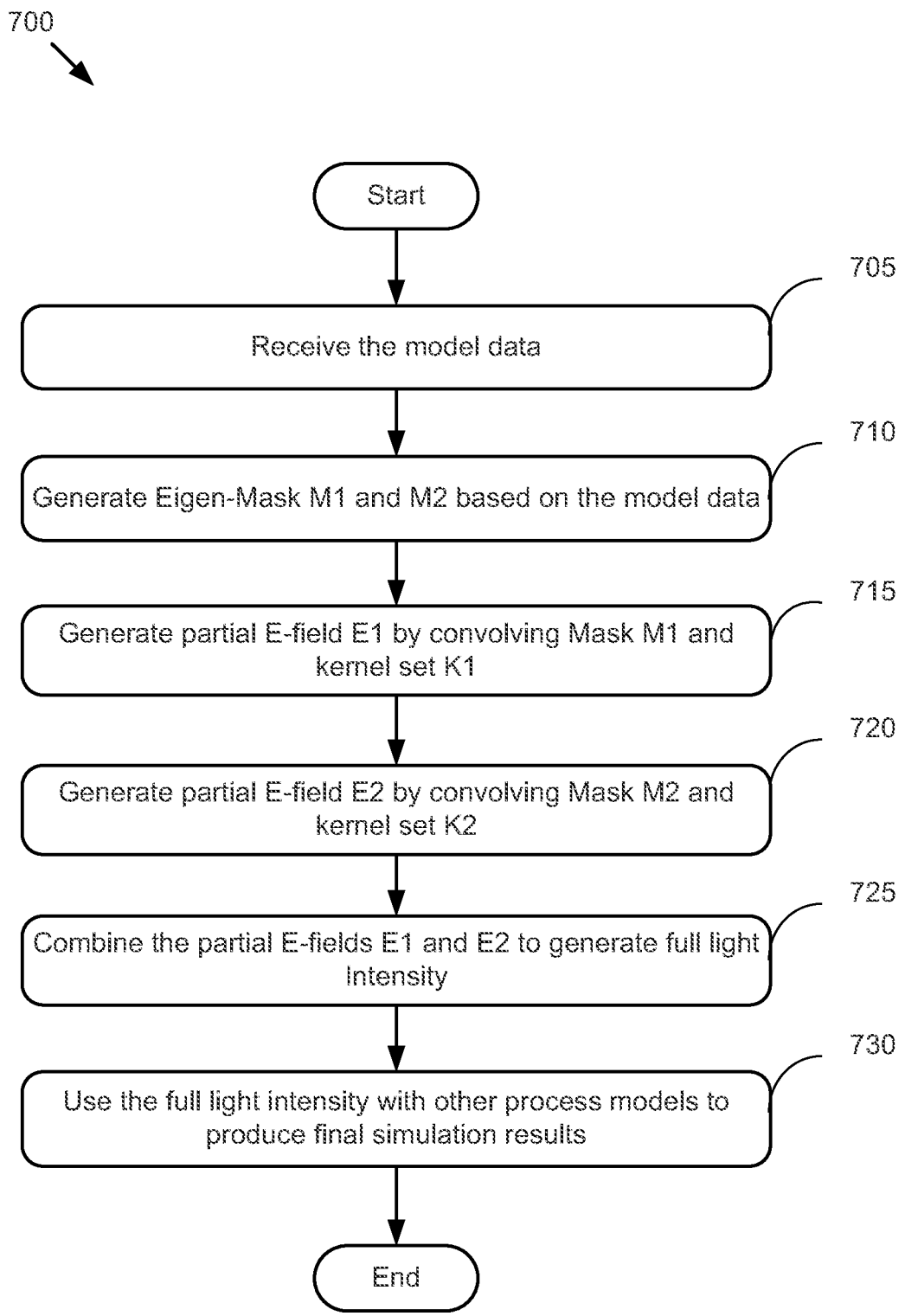
FIG. 7 is a flowchart of one embodiment of applying model data to generate light intensity.

FIG. 7 is a flowchart of one embodiment of applying the model data to generate light intensity. Specifically, this figure illustrates a process 700 for calculating light intensity using the Hopkins' method. In one embodiment, the process 700 starts when the model data for a design layout of a multi-tone mask becomes available. As shown in the figure, the process 700 begins by receiving, at block 705, the model data for a multi-tone mask. In one embodiment, the model data is the data generated in accordance with FIG. 6, described above. The model data may be retrieved from a database or other storage.

At block 710, the process 700 generates Eigen-masks $M_1$ and $M_2$ based on the model data. In one embodiment, Eigen-masks are generated according to Equation (8) described above. At block 715, the process 700 generates partial E-field $E_1$ by convolving Eigen-mask $M_1$ and Eigen-kernel set $K_1$, which is part of the model data. The process 700, at block 720, generates partial E-field $E_2$ by convolving Eigen-mask $M_2$ and Eigen-kernel set $K_2$, which is part of the model data. In one embodiment, Eigen-kernel set $K_1$ is larger than Eigen-kernel set $K_2$. Eigen-kernel set $K_1$ is for the major calculation and the Eigen-kernel set $K_2$ is for accuracy enhancement.

At block 725, the process 700 combine the partial E-fields $E_1$ and $E_2$ to generate full light Intensity. At block 730, the process 700 uses the full light intensity with other process models to produce final simulation results. In one embodiment, the final simulation results, e.g., simulated mask images, are displayed on a screen of an electronic device. In another embodiment, the final simulation results are saved to a non-volatile machine readable media. The process 700 then ends.

One of ordinary skill in the art will recognize that the process 700 is a conceptual representation of the operations used to implement the model data to calculate light intensity. The specific operations of the process 700 may not be performed in the exact order shown and described. For example, blocks 710 and 715 are not dependent on each other, and therefore can be performed in reverse order or in parallel. The specific operations may not be performed in one continuous series of operations, and different specific operations may be performed in different embodiments. Furthermore, the process could be implemented using several sub-processes, or as part of a larger macro process. For instance, in some embodiments, the process 700 is performed by one or more software applications that execute on one or more computers.

Figure 8:
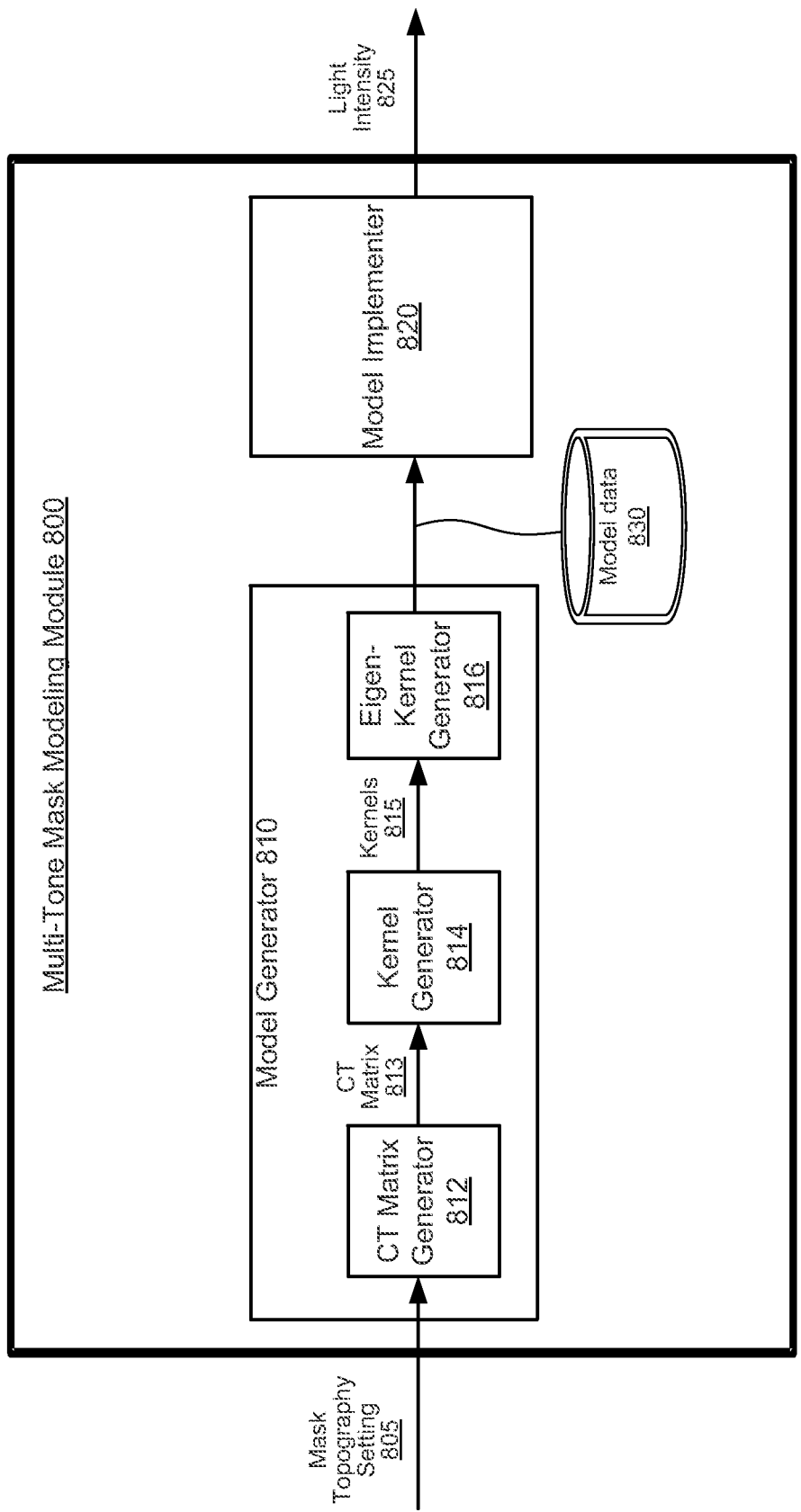
FIG. 8 conceptually illustrates one embodiment of a multi-tone mask modeling module.

FIG. 8 conceptually illustrates one embodiment of a multi-tone mask modeling module 800. In one embodiment, the multi-tone mask modeling module 800 is a stand-alone system. In another embodiment the multi-tone mask modeling module 800 is part of a system for performing electronic design automation (EDA) operations. As shown in the figure, the multi-tone mask modeling module 800 includes a model generator 810 and a model implementer 820. The model generator 810 includes a characteristic transmission function (CT) matrix generator 812, a kernel generator 814, and an Eigen-kernel generator 816.

The CT matrix generator 812 receives a mask topography setting 805. Based on the mask topography setting 805, the CT matrix generator 812 generates a CT matrix 813. In one embodiment, the CT matrix generator 812 generates the CT matrix 813 in accordance with Equations (1)-(4) described above.

The kernel generator 814 receives the CT matrix 813 from the CT matrix generator 812 and generates convolution kernels 815 based on the CT matrix 813. The kernel generator 814 then performs SVD on the convolution kernel in order to generate a set of convolution kernels for each mask tone. In one embodiment, the convolution kernels 815 can be used to transform a formula for calculating light intensity from Abbe's form to Hopkins' form while maintaining the accuracy of Abbe's form.

The Eigen-kernel generator 816 receives the kernels 815 from the kernel generator 814 and reduces the kernels 815 into a smaller set of Eigen-kernels. In one embodiment, the Eigen-kernel generator 816 reduce the kernels 815 through generating Eigen-kernels, as described in Equations (8) and (9) above, and retaining only two sets of the generated Eigen-kernels. In one embodiment, the Eigen-kernel generator 816 further reduces the number of kernels in each retained Eigen-kernel set while maintaining a relatively high accuracy. In one embodiment, the Eigen-kernel generator 816 reduces the two retained Eigen-kernel sets to contain different number of kernels, a larger set of Eigen-kernels for the major calculation and a smaller set of Eigen-kernels for accuracy enhancement.

In one embodiment, the Eigen-kernel generator 816 produces the reduced Eigen-kernel sets and linear transform vector V* and stores the reduced Eigen-kernel sets and the linear transform vector V* into model data 830. In one embodiment, the linear transform vector V* is described in Equations (8) and (9) above. In one embodiment, the model data 830 is stored in a database. In another embodiment, the model data is stored into one or more files. In one embodiment, the reduced Eigen-kernel sets and linear transform vector V* can be used to transform a formula for calculating light intensity from Abbe's form to Hopkins' form while maintaining the accuracy of Abbe's form.

The model implementer 820 receives the model data 830 from the Eigen-kernel generator 816. The model implementer 820 computes light intensity 825 based on the model data 830 using the Hopkins' method. In one embodiment, the model implementer 820 computes the light intensity 825 through the process described in FIG. 7 above. The model implementer 820 produces the light intensity 825 as the output of the multi-tone mask modeling module 800.

The multi-tone mask modeling module 800 is described above for one embodiment of the invention. One of ordinary skill in the art will realize that in other embodiments this module can be implemented differently. For instance, in one embodiment described above, certain modules are implemented as software modules. However, in another embodiment, some or all of the modules of the multi-tone mask modeling module 800 might be implemented by hardware, which can be dedicated application specific hardware (e.g., an ASIC chip or component) or a general purpose chip (e.g., a microprocessor or FPGA). In one embodiment, rather than co-existing with the model generator 810 in the multi-tone mask modeling module 800, the model implementer 820 can be part of a device or module that is separate from the multi-tone mask modeling module 800.

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 9:
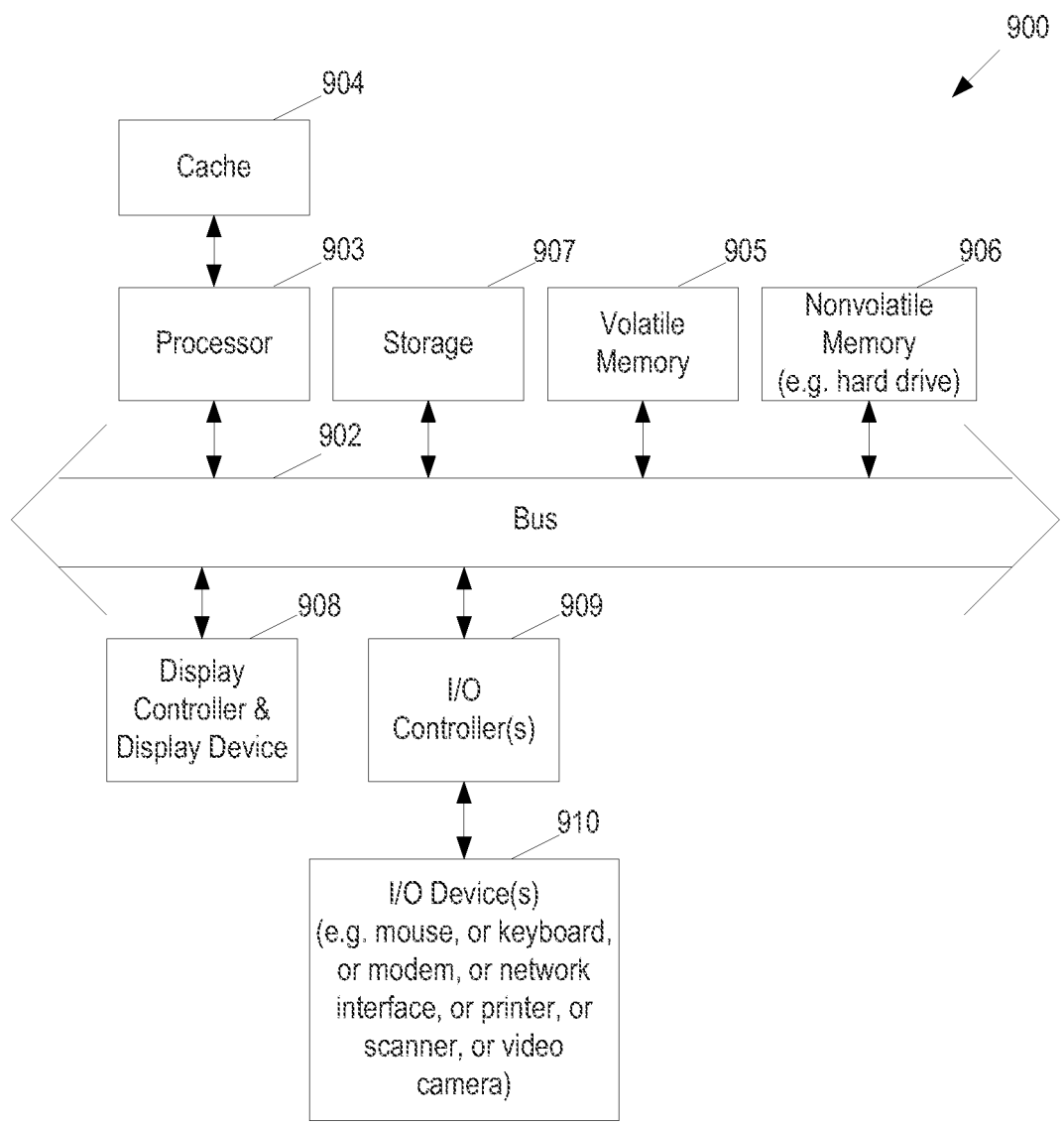
FIG. 9 shows one example of a typical computer system or data processing system that may be used with the disclosed embodiments.

FIG. 9 shows one example of a typical computer system or data processing system that may be used with the disclosed embodiments. For example, in one embodiment the processes described with respect to FIGS. 2, 6 and 7 are operational through the example computing system. However, it is noted that while FIG. 9 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 9 may be any computing system capable of performing the described operations.

As shown in FIG. 9, the computer system 900, which is a form of a data processing system, includes a bus 902, which is coupled to one or more microprocessors 903. In one embodiment, computer system 900 includes one or more of a storage device (e.g., ROM) 907, volatile memory (e.g., RAM) 905, and a non-volatile memory (EEPROM, Flash) 906. The microprocessor 903 is coupled to cache memory 904 as shown in the example of FIG. 9. Cache memory 904 may be volatile or non-volatile memory.

The bus 902 interconnects these various components together and in one embodiment interconnects these components 903, 907, 905, and 906 to a display controller and display device 908. The computer system 900 may further include peripheral devices such as input/output (I/O) devices, which may be mice, keyboards, modems, network interfaces, printers, scanners, video cameras and other devices which are well known in the art. Typically, the input/output devices 910 are coupled to the system through input/output controllers 909.

The volatile memory 905 is typically implemented as dynamic RAM (DRAM) which requires power continually in order to refresh or maintain data in the memory. The non-volatile memory 906 is typically a magnetic hard drive, magnetic optical drive, an optical drive, a DVD RAM, a Flash memory, or other type of memory system which maintains data even after power is removed from the system. Typically, the non-volatile memory will also be a random access memory, although this is not required.

While FIG. 9 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 902 may include one or more buses connected to each other through various bridges, controllers and/or adapters as is well known in the art. In one embodiment the I/O controller 909 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 2, 6 and 7 may be carried out in a computer system or other data processing system in response to its processor, such as a microprocessor, executing sequences of instructions contained in a memory, such as storage device 907, volatile memory 905, non-volatile memory 906, cache 904 or a remote storage device. In various embodiments, hardwired circuitry may be used in combination with software instructions to implement the disclosed embodiments. Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as microprocessor 903.

A machine readable storage medium can be used to store software and data, or program code, which when executed by a data processing system causes the system to perform various methods of the disclosed embodiments. This computer program product, which may include executable software and data may be stored in various places including, for example, storage device 907, volatile memory 905, non-volatile memory 906 and/or cache 904 as shown in FIG. 9. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or "generating" or "transforming" the like, refer to the action and processes of a computer system, or similar electronic computing device that manipulates and transforms data represented as physical (electronic) quantities within the computer system's registers and memories and other computer readable media into other data similarly represented as physical quantities within the computer system's memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A computer-implemented method of performing optical lithography simulation for a multi-tone mask with a plurality of mask tones, the method comprising:

generating, using a computing device, a transmission function matrix based on a setting of the multi-tone mask; and generating one or more convolution kernels for the multi-tone mask based on the transmission matrix, for use in transforming a formula for calculating light intensity from Abbe's form to Hopkins' form for the optical lithography simulation;

generating a set of Eigen-kernels for each mask tone based on the generated convolution kernels; and retaining a first set of Eigen-kernels associated with a first mask tone and a second set of Eigen-kernels associated with a second mask tone, reducing the first set and the second set of Eigen-kernels so that the first set of Eigen-kernels is larger than the second set of Eigen-kernels; and generating model data from the reduced convolution kernels.

2. The method of claim 1 further comprising generating an analytical form for each mask tone transmission.

3. The method of claim 1, wherein the first set of Eigen-kernels is used for major calculation and the second set of Eigen-kernels is used for accuracy enhancement.

4. The method of claim 1 further comprising saving the reduced first set and second set of Eigen-kernels into a model data.

5. The method of claim 1, wherein the generating of the transmission function matrix comprises transforming mask transmission under each light source point to a linear combination of a plurality of Zernike functions.

6. A data processing system for performing optical lithography simulation for a multi-tone mask with a plurality of mask tones, the data processing system comprising:

a matrix generator to generate a characteristic transmission (CT) function matrix based on a setting of the multi-tone mask; and a kernel generator to generate a set of one or more convolution kernels based on the CT function matrix, wherein the one or more convolution kernels include information for the light source and the one or more convolution kernels are used to transform a formula to calculate light intensity to Hopkins form for the optical lithography simulation;

an Eigen-kernel generator to reduce the set of one or more convolution kernels, wherein the Eigen-kernel generator reduces the set of convolution kernels by:

generating a set of Eigen-kernels for each mask tone based on the set of convolution kernels; and retaining a first set of Eigen-kernels associated with a first mask tone and a second set of Eigen-kernels associated with a second mask tone;

and wherein the Eigen-kernel generator further reduces the set of convolution kernels by reducing the first and second sets of Eigen-kernels so that the first set of Eigen-kernels is larger than the second set of Eigen-kernels.

7. The data processing system of claim 6, wherein the matrix generator generates the CT function matrix by transforming mask transmission under each light source point to a linear combination of a plurality of Zernike functions.

8. The data processing system of claim 6, wherein the first set of Eigen-kernels is used for major calculation and the second set of Eigen-kernels is used for accuracy enhancement.

9. The data processing system of claim 6, wherein the Eigen-kernel generator further records the reduced first set and second set of Eigen-kernels into a model data.

10. A computer program product stored as program code on a non-transitory computer-readable medium, the program code executable by at least one processor for performing optical lithography simulation for a multi-tone mask with a plurality of mask tones, the computer program product comprising a computer readable program code comprising instructions for:

receiving a model data that comprises a first set of Eigen-kernels associated with a first mask tone and a second set of Eigen-kernels associated with a second mask tone, the Eigen-kernels generated based on reduced convolution kernels; and retaining the first set of Eigen-kernels associated with the first mask tone and the second set of Eigen-kernels associated with the second mask tone;

reducing the first set and the second set of Eigen-kernels so that the first set of Eigen-kernels is larger than the second set of Eigen-kernels; and computing the light intensity based on the reduced set of Eigen-kernels.

11. The computer program product of claim 10, wherein the instructions for computing of the light intensity comprises instructions for:

generating a first Eigen-mask and a second Eigen-mask based on the model data;

generating a first partial E-field and a second partial E-field based on the first and second Eigen-masks and the first and second sets of Eigen-kernels; and generating the light intensity by combining the first partial E-field and the second partial E-field.

12. The computer program product of claim 11, wherein the instructions for generating of the first partial E-field and the second partial E-field comprises instructions for:

generating the first partial E-field by convolving the first Eigen-mask and the first set of Eigen-kernels; and generating the second partial E-field by convolving the second Eigen-mask and the second set of Eigen-kernels.

13. The computer program product of claim 10, wherein the first and second sets of Eigen-kernels are generated based on a transmission function matrix.

14. The computer program product of claim 13, wherein the transmission function matrix is generated based on a mask topography.

* * * * *